US012796565B2

(12) United States Patent
Yang et al.

(10) Patent No.: US 12,796,565 B2
(45) Date of Patent: Nov. 10, 2026

(54) SEMICONDUCTOR DEVICE AND METHOD OF MAKING A DUAL-SIDED BRIDGE DIE PACKAGE STRUCTURE

(71) Applicant: STATS ChipPAC Pte. Ltd., Singapore (SG)

(72) Inventors: DanFeng Yang, Jiangyin (CN); Yaojian Lin, Jiangyin (CN); Linda Pei Ee Chua, Singapore (SG); Kai Chong Chan, Singapore (SG); Jian Zuo, Singapore (SG)

(73) Assignee: STATS ChipPAC Pte. Ltd., Singapore (SG)

( * ) Notice: Subject to any disclaimer, the term of this patent is extended or adjusted under 35 U.S.C. 154(b) by 456 days.

(21) Appl. No.: 18/492,047

(22) Filed: Oct. 23, 2023

(65) Prior Publication Data

US 2025/0132291 A1 Apr. 24, 2025

(51) Int. Cl.

| | |
|---|---|
| ***H10W 90/00*** | (2026.01) |
| ***H05K 1/11*** | (2006.01) |
| ***H05K 1/181*** | (2026.01) |
| ***H10W 70/65*** | (2026.01) |

(52) U.S. Cl.

CPC ............. *H10W 90/00* (2026.01); *H05K 1/111* (2013.01); *H05K 1/181* (2013.01); *H10W 70/65* (2026.01); *H10W 90/701* (2026.01); *H10W 90/734* (2026.01); *H10W 90/753* (2026.01)

(58) Field of Classification Search

None

See application file for complete search history.

(56) References Cited

U.S. PATENT DOCUMENTS

| | | | | |
|---|---|---|---|---|
| 9,831,148 | B2 | 11/2017 | Yu et al. | |
| 11,217,563 | B2 | 1/2022 | Zhai | |
| 2023/0034737 | A1 | 2/2023 | Wang et al. | |
| 2025/0054926 | A1 * | 2/2025 | Chen | H10P 72/74 |
| 2025/0062208 | A1 * | 2/2025 | Suk | H10W 90/00 |
| 2025/0096098 | A1 * | 3/2025 | Yim | H10W 20/20 |

* cited by examiner

*Primary Examiner* — Daniel Whalen

(74) *Attorney, Agent, or Firm* — Brian M. Kaufman; Robert D. Atkins; PATENT LAW GROUP: Atkins and Associates, P.C.

(57) ABSTRACT

A semiconductor device has a first interconnect structure. A first bridge die is disposed over the first interconnect structure. An encapsulant is deposited over the first bridge die. A second interconnect structure is formed over the first bridge die and encapsulant. A second bridge die is disposed over the second interconnect structure.

24 Claims, 10 Drawing Sheets

SEMICONDUCTOR DEVICE AND METHOD OF MAKING A DUAL-SIDED BRIDGE DIE PACKAGE STRUCTURE

FIELD OF THE INVENTION

The present invention relates in general to semiconductor devices and, more particularly, to a semiconductor device and method of making a dual-sided bridge die package structure.

BACKGROUND OF THE INVENTION

Semiconductor devices are commonly found in modern electronic products. Semiconductor devices perform a wide range of functions such as signal processing, high-speed calculations, transmitting and receiving electromagnetic signals, controlling electronic devices, transforming sunlight to electricity, and creating visual images for television displays. Semiconductor devices are found in the fields of communications, power conversion, networks, computers, entertainment, and consumer products. Semiconductor devices are also found in military applications, aviation, automotive, industrial controllers, and office equipment.

Semiconductor devices may contain multiple electrical components, e.g., one or more semiconductor die and myriad discrete components to support the semiconductor die, disposed on one or more substrates to perform necessary electrical functions. Highly integrated packages with several components are commonly referred to as system-in-package (SiP) modules. SiP modules often have multiple semiconductor die that must communicate with each other at very high bandwidths. Conductive traces formed at the package level may be insufficient to support the necessary bandwidth.

Many SiP packages utilize bridge die to facilitate high-bandwidth communication between components in a SiP device. Bridge die are semiconductor die that may have no circuits formed in their active surface but have fine-pitched interconnects formed over them. Bridge die can be disposed between two other semiconductor die, then both semiconductor die are connected to each other through the bridge die to increase the available data bandwidth between them.

Bridge die are helpful for complicated SiP modules, but introduce additional design constraints due to the additional component required. Therefore, a need exists for improved bridge die topologies.

DETAILED DESCRIPTION OF THE DRAWINGS

The present invention is described in one or more embodiments in the following description with reference to the figures, in which like numerals represent the same or similar elements. While the invention is described in terms of the best mode for achieving the invention's objectives, it will be appreciated by those skilled in the art that it is intended to cover alternatives, modifications, and equivalents as may be included within the spirit and scope of the invention as defined by the appended claims and their equivalents as supported by the following disclosure and drawings. The features shown in the figures are not necessarily drawn to scale. Elements assigned the same reference number in the figures have a similar function to each other. The term "semiconductor die" as used herein refers to both the singular and plural form of the words, and accordingly, can refer to both a single semiconductor device and multiple semiconductor devices.

Semiconductor devices are generally manufactured using two complex manufacturing processes: front-end manufacturing and back-end manufacturing. Front-end manufacturing involves the formation of a plurality of die on the surface of a semiconductor wafer. Each die on the wafer contains active and passive electrical components, which are electrically connected to form functional electrical circuits. Active electrical components, such as transistors and diodes, have the ability to control the flow of electrical current. Passive electrical components, such as capacitors, inductors, and resistors, create a relationship between voltage and current necessary to perform electrical circuit functions.

Back-end manufacturing refers to cutting or singulating the finished wafer into the individual semiconductor die and packaging the semiconductor die for structural support, electrical interconnect, and environmental isolation. To singulate the semiconductor die, the wafer is scored and broken along non-functional regions of the wafer called saw streets or scribes. The wafer is singulated using a laser cutting tool or saw blade. After singulation, the individual semiconductor die are disposed on a package substrate that includes pins or contact pads for interconnection with other system components. Contact pads formed over the semiconductor die are then connected to contact pads within the package. The electrical connections can be made with conductive layers, bumps, stud bumps, conductive paste, or wirebonds. An encapsulant or other molding material is deposited over the package to provide physical support and electrical isolation. The finished package is then inserted into an electrical system and the functionality of the semiconductor device is made available to the other system components.

Figure 1A:
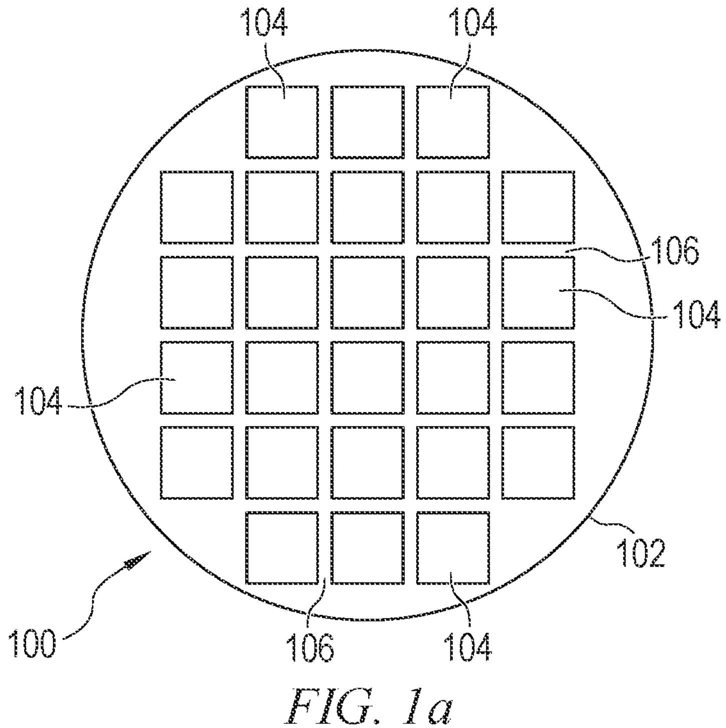
FIGS. 1*a*-1*c* illustrate a semiconductor wafer with a plurality of bridge die separated by a saw street.

FIG. 1*a* shows a semiconductor wafer 100 with a base substrate material 102, such as silicon, germanium, aluminum phosphide, aluminum arsenide, gallium arsenide, gallium nitride, indium phosphide, silicon carbide, or other bulk material for structural support. A plurality of semiconductor die, bridge die, or other components 104 is formed on wafer 100 separated by a non-active, inter-die wafer area or saw street 106. Saw street 106 provides cutting areas to singulate semiconductor wafer 100 into individual bridge die 104. In one embodiment, semiconductor wafer 100 has a width or diameter of 100-450 millimeters (mm). Wafer 100 can include hundreds or thousands of die 104.

Figure 1B:
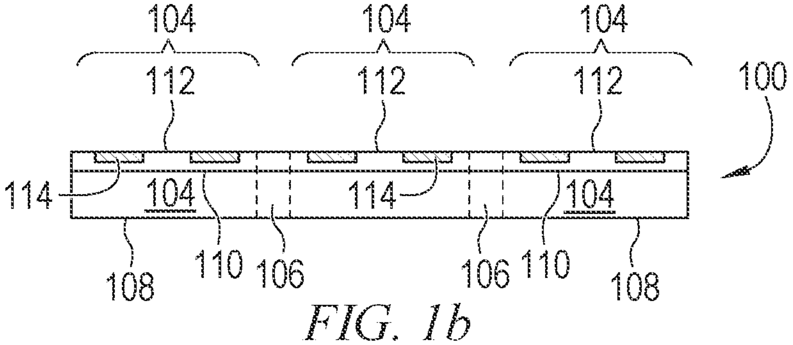
Figure 1C:
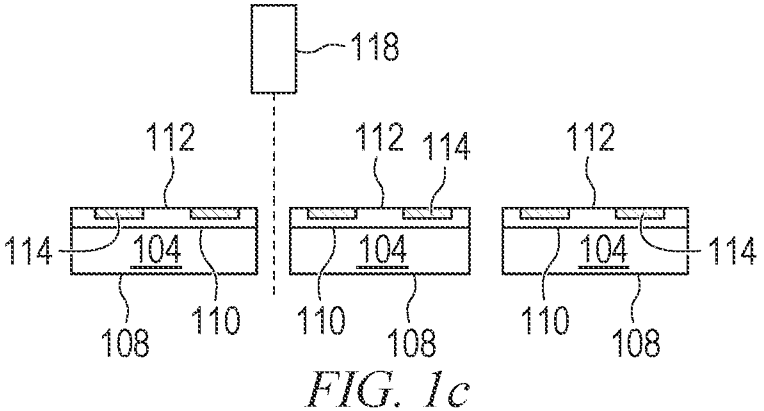

FIG. 1*b* shows a cross-sectional view of a portion of semiconductor wafer 100. Each bridge die 104 has a back or non-active surface 108 and an active surface 110 optionally containing analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within active surface 110 to implement analog circuits or digital circuits, such as a digital signal processor (DSP), application specific integrated circuits (ASIC), memory, or other signal processing circuit. Bridge die 104 may also contain IPDs, such as inductors, capacitors, and resistors, for RF signal processing.

An interconnect structure 112 is formed over active surface 110. Interconnect structure 112 includes fine-pitched conductive traces, e.g., less than two micrometers (microns) in both line width and spacing between the lines. Interconnect structure 112 may have one or more than one layer of conductive traces with insulating layers formed between the layers. Interconnect structure 112 is illustrated as just a region because the pitch of the interconnects are too fine to illustrate other than conceptually. The area identified as interconnect structure 112 in the figure is occupied by a fine-pitched interconnect structure in any suitable configuration, e.g., electrically coupling the pair of contact pads 114 of each bridge die 104 to each other.

Interconnect structure 112 includes contact pads 114 formed at the top of the interconnect structure for external connections to interconnect structure 112. Contact pads 114 are larger than two micron to allow conductive vias or other conductive structures to contact or be formed on the contact pads and thereby electrically connect to the underlying fine-pitched conductive traces of interconnect structure 112.

Conductive traces of interconnect structure 112 and contact pads 114 are formed over active surface 110 using physical vapor deposition (PVD), chemical vapor deposition (CVD), electrolytic plating, electroless plating, or another suitable metal deposition process. Conductive traces of interconnect structure 112 and contact pads 114 can be one or more layers of aluminum (Al), copper (Cu), tin (Sn), nickel (Ni), gold (Au), silver (Ag), or other suitable electrically conductive material. Contact pads 114 include an under-bump metallization (UBM) in some embodiments.

Interconnect structure 112 includes insulating layers formed over and between the conductive traces. Insulating layers of interconnect structure 112 contain one or more layers of silicon dioxide (SiO2), silicon nitride (Si3N4), silicon oxynitride (SiON), tantalum pentoxide (Ta2O5), aluminum oxide (Al2O3), solder resist, polyimide (PI), benzocyclobutene (BCB), polybenzoxazoles (PBO), and other material having similar insulating and structural properties. Insulating layers can be formed using PVD, CVD, printing, lamination, spin coating, spray coating, sintering, thermal oxidation, or another suitable process. Interconnect structure 112 can include any number of conductive layers and insulating layers interleaved over each other.

Figure 2A:
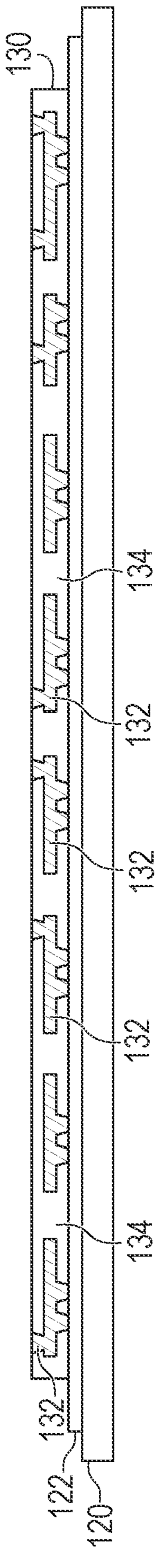
FIGS. 2*a*-2*h* illustrate forming a system-in-package module with the bridge die in a dual-sided configuration.

FIGS. 2*a*-2*h* illustrate the formation of system-in-package (SiP) modules using bridge die 104. FIG. 2*a* shows a cross-sectional view of a portion of a carrier or temporary substrate 120 containing sacrificial base material such as silicon, polymer, beryllium oxide, glass, or other suitable low-cost, rigid material for structural support. An interface layer or double-sided tape 122 is formed or disposed over carrier 120 as a temporary adhesive bonding film, etch-stop layer, thermal release layer, or UV release layer. Carrier 120 can be a round or rectangular panel with capacity for multiple SiP modules to be formed at once. While only one unit is illustrated being formed, tens, hundreds, thousands, or more modules may be formed together on a common carrier 120.

An interconnect structure 130 is formed or disposed on carrier 120. Interconnect structure 130 includes one or more conductive layers 132 and one or more insulating layers 134. Conductive layers 132 can be formed using the materials and methods described above for the conductive layers of interconnect structure 112. Conductive layers 132 provide horizontal electrical interconnect across interconnect structure 130 and vertical electrical interconnect between surfaces and layers of the interconnect structure. Portions of conductive layers 132 can be electrically common or electrically isolated depending on the design and function of the package being formed.

In some embodiments, interconnect structure 130 is a preformed interposer or substrate that is completely formed prior to disposing the interconnect structure onto carrier 120. In another embodiment, interconnect structure 130 is formed directly on carrier 120 by successively forming a plurality of insulating layers 134 and conductive layers 132 on the carrier. Interconnect structure 130 is typically large enough to accommodate all of the SiP modules being formed at once on carrier 120 and then singulated along with the final modules. In other embodiments, a separate interconnect structure 130 is provided or formed for each SiP module.

Figure 2B:
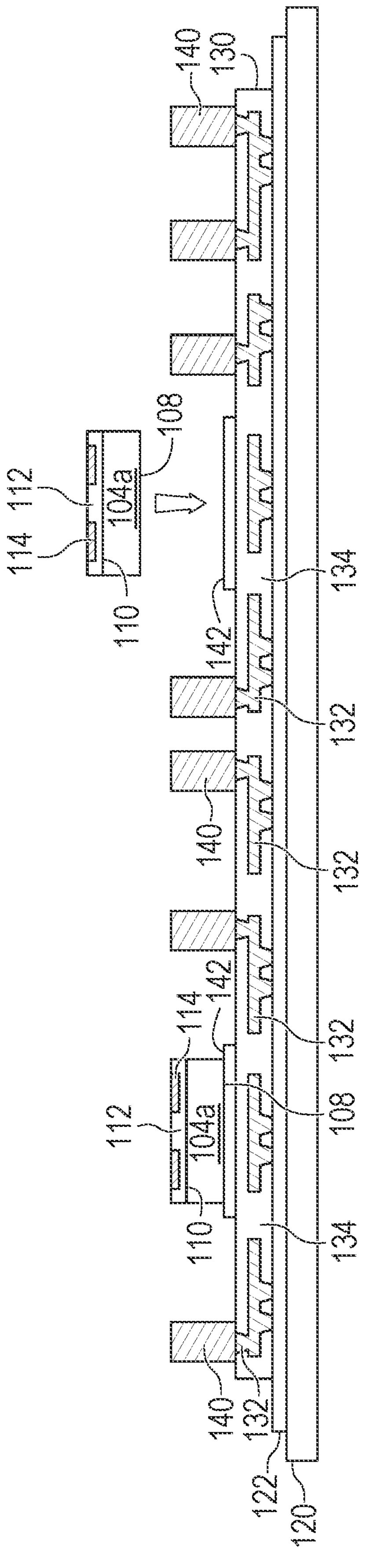

In FIG. 2*b*, conductive pillars 140 are formed on interconnect structure 130 at points where conductive layer 132 is exposed as contact pads. Conductive pillars 140 are formed by depositing conductive material into photolithographic mask openings in one embodiment. In another embodiment, conductive pillars 140 are preformed and then picked and placed onto interconnect structure 130. Solder or solder paste can be used to connect pillars 140 to interconnect structure 130. Conductive pillars 140 can be formed of any of the conductive materials mentioned above and using any suitable manufacturing process.

A die attach adhesive 142 is disposed on interconnect structure 130 at locations where bridge die 104 are desired to be mounted. Bridge die 104*a* are picked and placed onto die attach adhesive 142 with interconnect structure 112 oriented away from carrier 120. Top surfaces of bridge die 104*a* are approximately coplanar to top surfaces of pillars 140 in some embodiments. Two bridge die 104*a* are used in the figure, but any number of bridge die can be used in other embodiments. Other components, including other types of semiconductor die or discrete active or passive components can also be disposed on interconnect structure 130 at the present stage. Bridge die 104*a* can both be the same or configured with different layouts depending on the needs of the specific use-case.

Figure 2C:
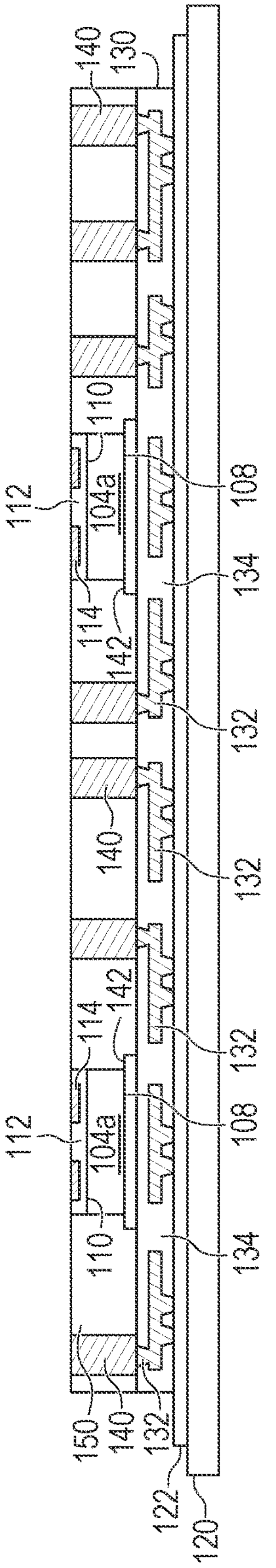

In FIG. 2*c*, encapsulant or molding compound 150 is deposited over and around carrier 120, interconnect structure 130, conductive pillars 140, and bridge die 104*a* using a paste printing, compressive molding, transfer molding, liquid encapsulant molding, vacuum lamination, spin coating, or another suitable applicator. Encapsulant 150 can be liquid or granular polymer composite material, such as epoxy resin, epoxy acrylate, or polymer, with or without an added filler. Encapsulant 150 is non-conductive, provides structural support, and environmentally protects bridge die 104*a* from external elements and contaminants. In one embodiment, encapsulant 150 is deposited to have a top surface coplanar to the top surfaces of conductive pillars 140 and bridge die 104*a*, e.g., by using film-assisted molding. In another embodiment, encapsulant 150 is deposited to cover the top surfaces conductive pillars 140 and bridge die 104*a* and then backgrinded to make the surfaces coplanar. Conductive pillars 140 can start out taller than bridge die 104*a* and then be backgrinded with encapsulant 150. In some embodiments, conductive pillars 140 are replaced by conductive vias formed through encapsulant 150 after the encapsulant is deposited over bridge die 104*a*.

Figure 2D:
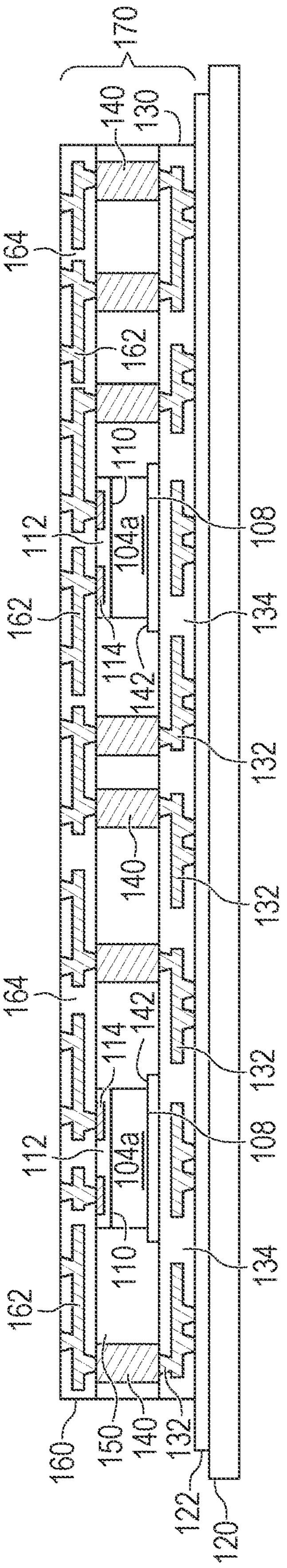

In FIG. 2*d*, an interconnect structure 160 is formed or disposed over encapsulant 150. Interconnect structure 160 is formed and structured similarly to interconnect structure 130 on the opposite side of encapsulant 150 with conductive layers 162 interleaved between insulating layers 164. Interconnect structure 160 can be formed directly on top of encapsulant 150 or formed separately and disposed onto the encapsulant. Conductive layers 162 include conductive vias that extend down to the bottom surface of interconnect structure 160 to physically and electrically contact conductive pillars 140 and contact pads 114 of bridge die 104*a*.

In combination, interconnect structure 130, conductive pillars 140, bridge die 104*a*, and interconnect structure 160 form a fan-out interposer 170. Interposer 170 can operate as the package substrate for a semiconductor package and has bridge die 104*a* embedded within the interposer.

Figure 2E:
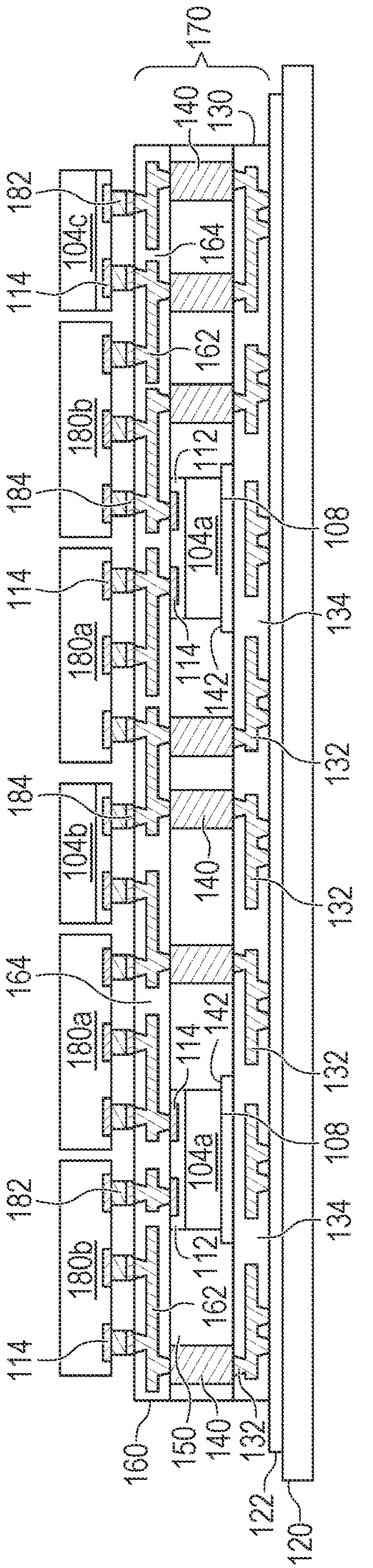

In FIG. 2*e*, forming a SiP module with interposer 170 as the package substrate begins by mounting additional bridge die 104, semiconductor die 180, and any other desired components onto interconnect structure 160. Semiconductor die 180 are formed similarly to bridge die 104, but may not have such a fine-pitched interconnect structure 112. Semiconductor die 180 still have conductive and insulating layers stacked on their active surfaces culminating with contact pads 114 exposed over the active surfaces of each die.

Conductive micropillars 182 are formed on contact pads 114 of each die 180 and 104 to provide connection to interconnect structure 160. Conductive micropillars 182 are typically formed by depositing conductive material into openings of a photolithographic layer and then removing the photolithographic layer. The metal can be any mentioned above for conductive layers. A solder or solder paste layer 184 is disposed on micropillars 182 for electrical and mechanical connection of die 180 and 104 to conductive layers 162. Micropillars 182 represent just one possible interconnect method. Other embodiments use bond wires, conductive paste, stud bumps, solder bumps, or any other suitable type of electrical interconnect. Die 180 and 104 are picked and placed over interposer 170 with pillar bumps 182 oriented toward the interposer. Die 180 and 104 are set on interposer 170, and then solder 184 is reflowed to mechanically attach the die to the interposer.

As only one of nearly infinite possible examples, FIG. 2*e* shows a pair of main die 180*a* with bridge die 104*b* disposed between the main die. Main die 180*a* can be any type of die that serves the main function of the package being formed, e.g., ASICs, microprocessors, central processing units (CPU), graphical processing units (GPU), accelerators, or logic die. Main die 180*a* can be identical to each other or different, e.g., a GPU and a CPU. Main die 180*a* are each separately coupled to bridge die 104*b*, and then to each other through the bridge die. Bridge die 104*b* provides faster and higher density interconnect than what is available through interconnect structure 160. Only a small portion of the interconnect between main die 180*a* occurs in interconnect structure 160, while most of the interconnect distance is through bridge die 104*b*. Components are not to scale, and the proportion of distance covered by bridge die 104*b* in practice will be much greater than illustrated.

A pair of high-bandwidth memory (HBM) die 180*b* is disposed with one HBM die next to each main die 180*a*. HBM is random-access memory (RAM) available with relatively high bandwidth to each main die 180*a*. Each main die 180*a* is connected to a respective HBM die 180*b* through a bridge die 104*a* within interposer 170. In plan view, each main die 180*a* and its respective HBM die 180*b* both overlap a common bridge die 104*a* within interposer 170, which allows a direct vertical connection between the upper die and bridge die. Bridge die 104*a* operates similarly to bridge die 104*b*, providing high speed interconnect between two other die. However, bridge die 104*a* is formed in a second layer, i.e., within interposer 170, rather than within the same layer as the connected die, which is the case with bridge die 104*b*. Similar to bridge die 104*b*, interconnect structure 160 couples each bridge die 104*a* to a main die 180*a* on one side and an HBM die 180*b* on the opposite side, while the majority of the interconnect distance is through bridge die 104*a*.

A bridge die 104*c* on top of interposer 170 can be used to couple HBM die 180*b* to another die in another cross-section or to couple together two different die in other cross-sections. Two bridge die 104*b* and 104*c* are illustrated on top of interposer 170, but any number of bridge die can be used as needed for the particular use-case. Bridge die 104*b* and 104*c* can be identical to bridge die 104*a* and come from the same wafer 100 or have different layouts that are configured to their particular situation and come from different wafers. Alternatively, bridge die 104*c* can be replaced with a NAND flash device or an I/O die as needed. Any other desired components, such as other die or discrete active or passive components can be disposed on interposer 170 in addition to or instead of the illustrated die.

Figure 2F:
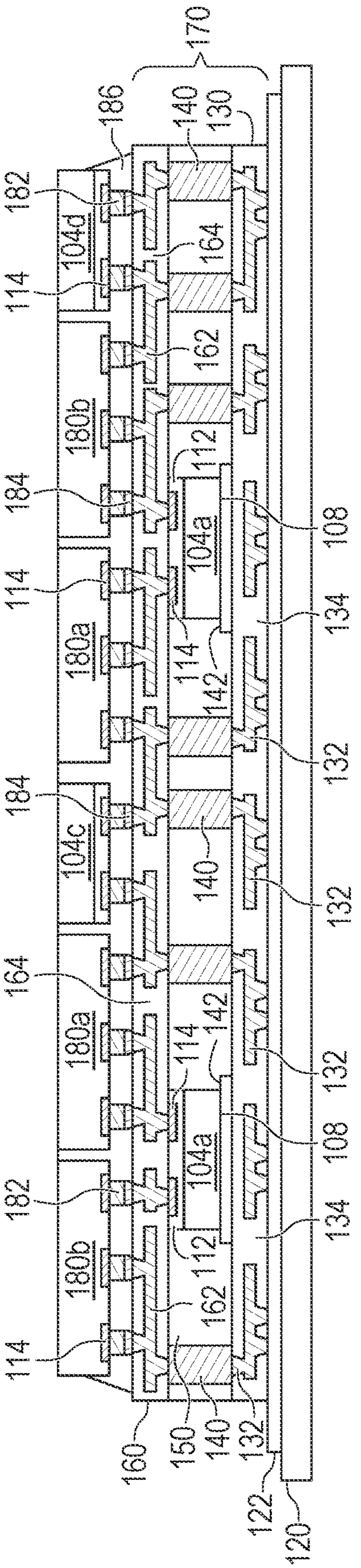
Figure 2G:
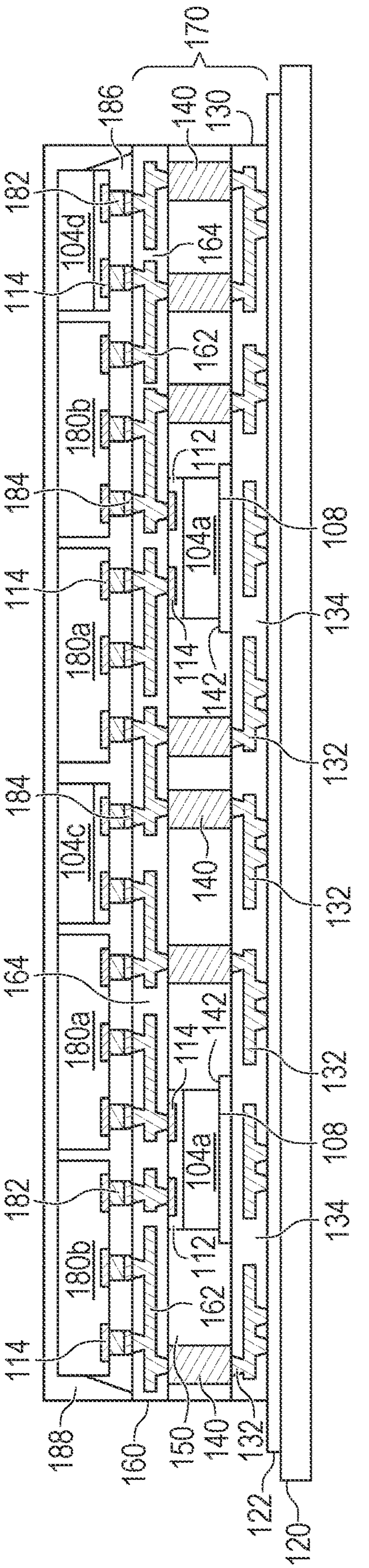

In FIG. 2*f*, a mold underfill 186 is dispensed between interposer 170 and die 104*b*, 104*c*, 180*a*, and 180*b*. Capillary action draws mold underfill 186 under the die to completely fill in the gaps between each die and interposer 170. In some embodiments, mold underfill 186 also flows up between adjacent die. A second encapsulant 188 is deposited over interposer 170, main die 180*a*, HBM die 180*b*, bridge die 104*b*, and bridge die 104*c* in FIG. 2*g*. Encapsulant 188 is deposited using similar methods and materials as disclosed above for encapsulant 150. In some embodiments, film-assisted molding is used to leave the back surfaces of die 180*a*, 180*b*, 104*b*, and 104*c* exposed from encapsulant 188. Encapsulant 188 can alternatively be backgrinded to expose the die.

Figure 2H:
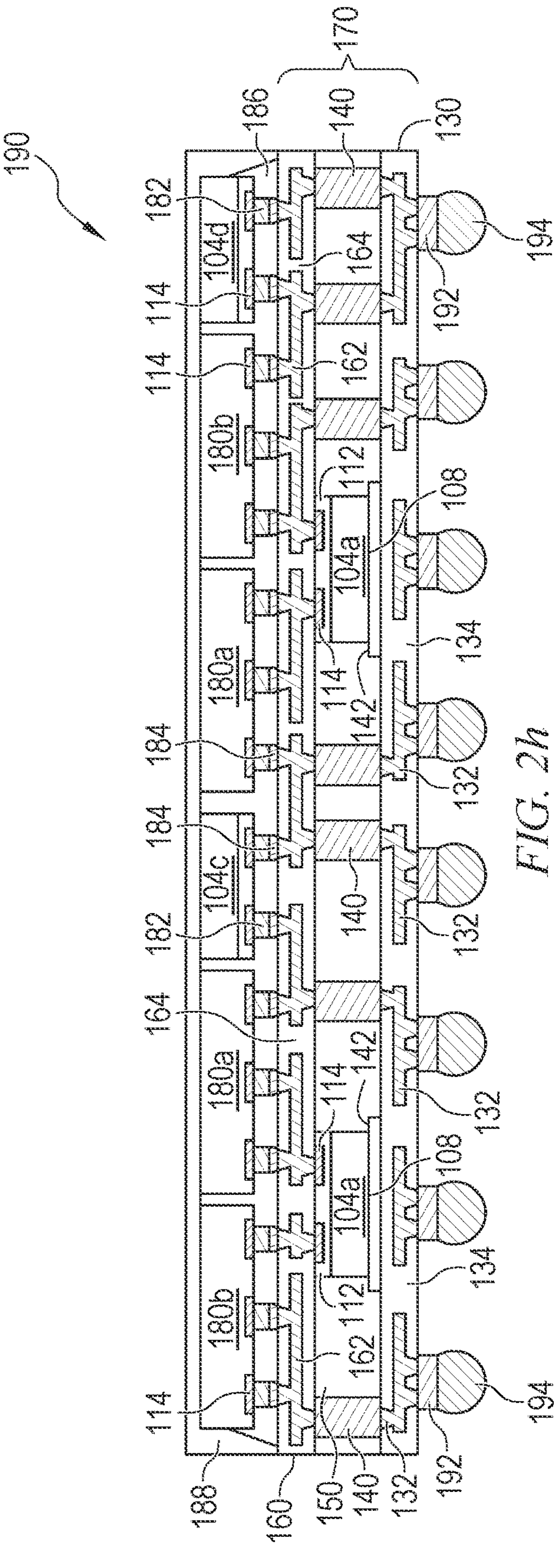

A SiP module 190 is completed in FIG. 2*h* by removing interposer 170 from carrier 120 and forming under-bump metallization (UBM) 192 and solder bumps 194 on the newly-exposed surface of interconnect structure 130. UBM 192 is a conductive layer including a wetting layer, barrier layer, and adhesion layer in some embodiments. Each portion of UBM 192 is formed directly on an exposed conductive via of conductive layer 132 to provide external connection from an external system to the multiple system components within SiP module 190.

An electrically conductive bump material is deposited over UBM 192 using an evaporation, electrolytic plating, electroless plating, ball drop, or screen printing process. The bump material can be Al, Sn, Ni, Au, Ag, lead (Pb), bismuth (Bi), Cu, solder, and combinations thereof, with an optional flux solution. For example, the bump material can be eutectic Sn/Pb, high-lead solder, or lead-free solder. The bump material is bonded to UBM 192 using a suitable attachment or bonding process. In one embodiment, the bump material is reflowed by heating the material above its melting point to form bumps 194. Bump 194 can also be compression bonded or thermocompression bonded to UBM 192 or attached directly to conductive layer 132 without a UBM.

The panel is singulated through interposer 170 and encapsulant 188 to separate individual SiP modules 190 from each other, and then picked and placed into a tape-and-reel or other container for delivery. SiP module 190 is referred to as having dual-sided bridge die 104 because the bridge die are on two sides of a single interconnect structure, interconnect structure 160 in this case. Dual-sided bridge die 104 increases design flexibility by increasing the options for locating the bridge die. The dual-sided bridge die topology disclosed above provides more flexibility in chiplet architecture design with balanced yield, warpage, reliability, and overall cost.

Figure 3:
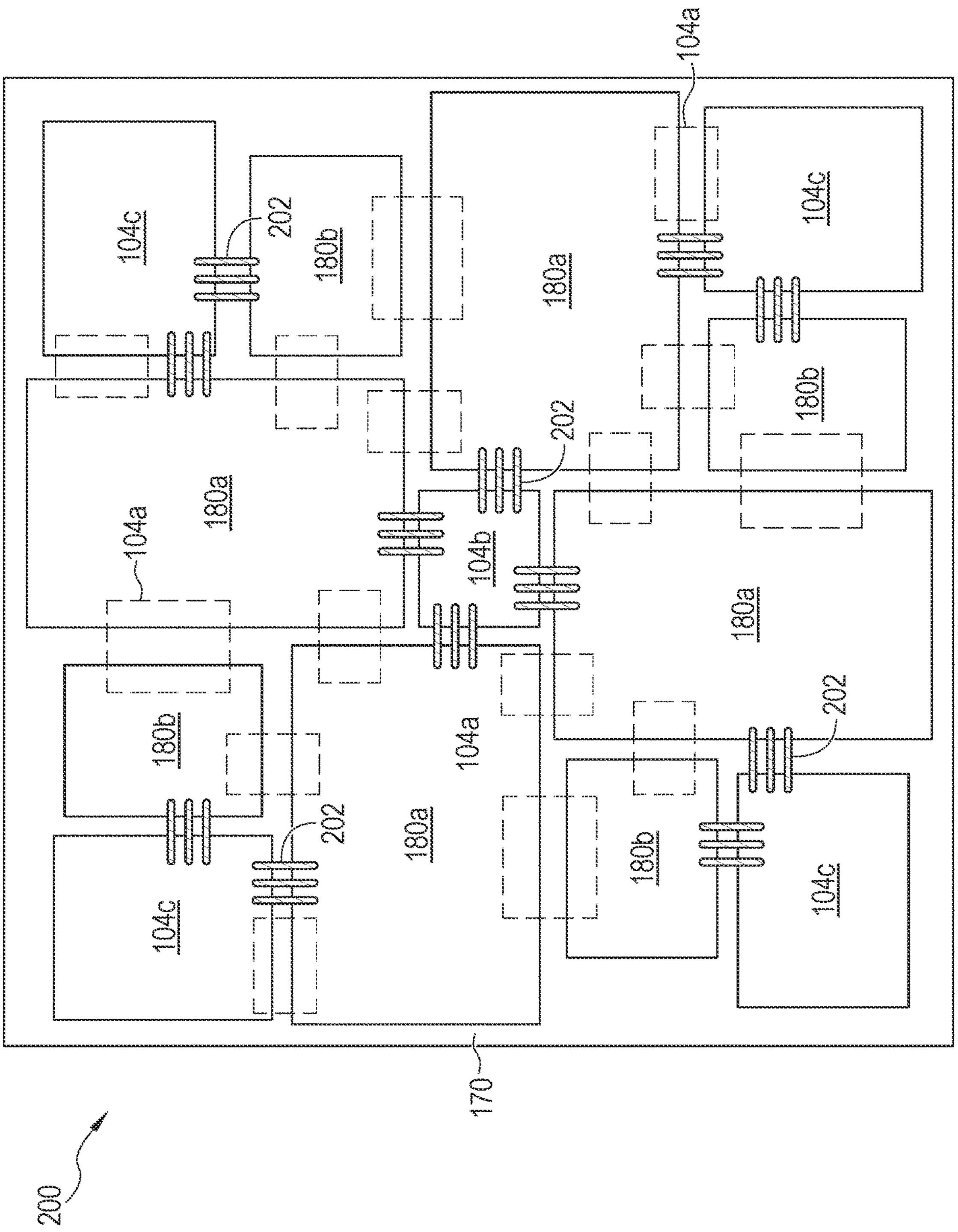
FIG. 3 illustrates an example plan view of the system-in-package module.

FIG. 3 shows one possible plan view that can be formed using the above-described process as SiP module 200. The die on top of interposer 170 are drawn in solid lines and the bridge die 104*a* within the interposer are drawn in dashed lines so that their relative locations can be observed. Four main die 180*a* are disposed radiating out in four directions from a centrally located bridge die 104*b*. Each of the four main die 180*a* is located adjacent to a respective bridge die 104*c* and HBM die 180*b*. The bridge die 104*c* in the corners of SiP module 200 can be a NAND flash device or an I/O die instead of a bridge die as needed.

Each bridge die 104*a* embedded within interposer 170 is overlapped by two components on top of the interposer. Each bridge die 104*a* is coupled to each overlying component by conductive vias of interconnect structure 160 and couples the two overlying components together. The conductive paths 202 represent connections made directly by interconnect structure 160 without going through a bridge die. Some components are coupled together both directly through interconnect structure 160 and also through a bridge die 104. In some embodiments, bridge die 104 are relied upon for high-bandwidth data lines while power, ground, control signals, and other lower bandwidth signals are routed directly between the die using only interconnect structure 160.

Figure 4A:
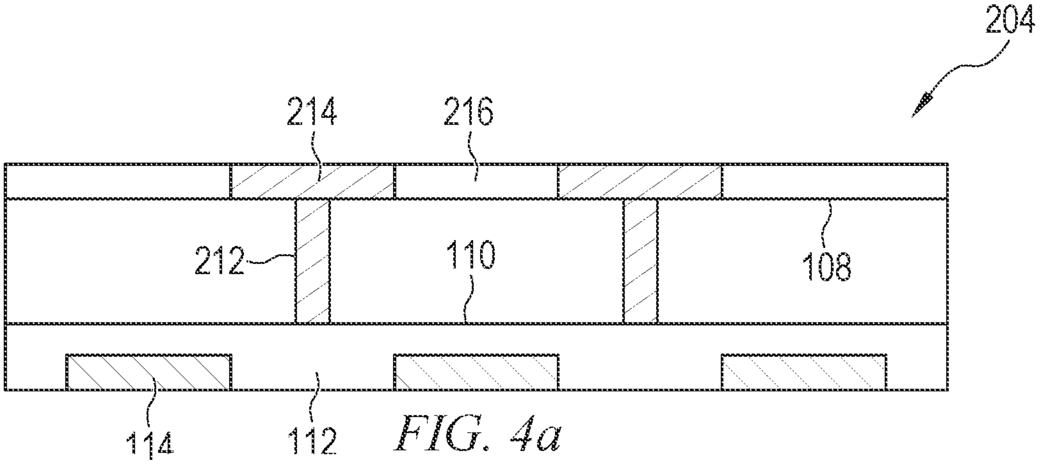
FIGS. 4*a* and 4*b* illustrate a bridge die with backside-revealed conductive vias.
Figure 4B:
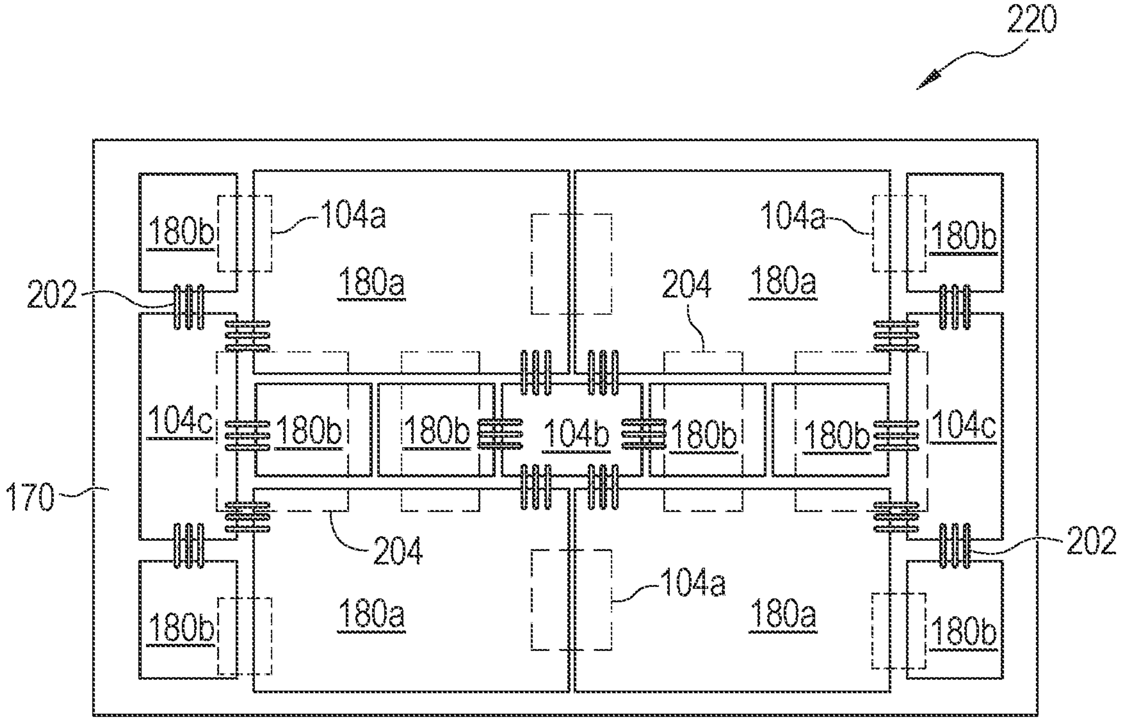

FIGS. 4*a* and 4*b* show an embodiment with bridge die 204 having through-silicon vias (TSV) 212 formed through the die between active surface 110 and back surface 108. Contact pads 214 and passivation layer 216 are formed over TSV 212 for coupling by other interconnect structures. Contact pads 214 and TSV 212 allow electrical connection from back surface 108 to interconnect structure 112 over active surface 110. Bridge die 204 are formed as shown in FIG. 4*a* and then singulated from a semiconductor wafer. Vias 212 can be formed by mechanically drilling through or into die 204 and then filling the opening with conductive material.

FIG. 4*b* shows a plan view of an example SiP module 220 made with bridge die 204. SiP module 220 is formed as described above, but with both bridge die 104*a* and bridge die 204 embedded in interposer 170. Interconnect structure 130 on the bottom side of interposer 170 is electrically coupled to contact pads 214 and conductive vias 212 in addition to or instead of conductive pillars 140. Solder can be used to electrically couple and mount bridge die 204 onto contact pads of conductive layer 132. Alternatively, bridge die 104*a* and 204 can be encapsulated first and then flipped to form interconnect structure 130 directly on the panel of encapsulant 150 and bridge die. Conductive layer 132 is then formed with conductive vias directly contacting contact pads 214.

SiP module 220 has four bridge die 204 lined along the center of the SiP module and three bridge die 104*a* along the top and bottom edges. Bridge die 204 each overlap two opposing main die 180*a* and a centrally located HBM die 180*b*. Bridge die 204 can electrically connect the opposing main die 180*a* directly together in addition to coupling both main die to the HBM die 180*b* between the two. Any suitable number of die can be connected together by a single bridge die 104 or 204.

Figure 5:
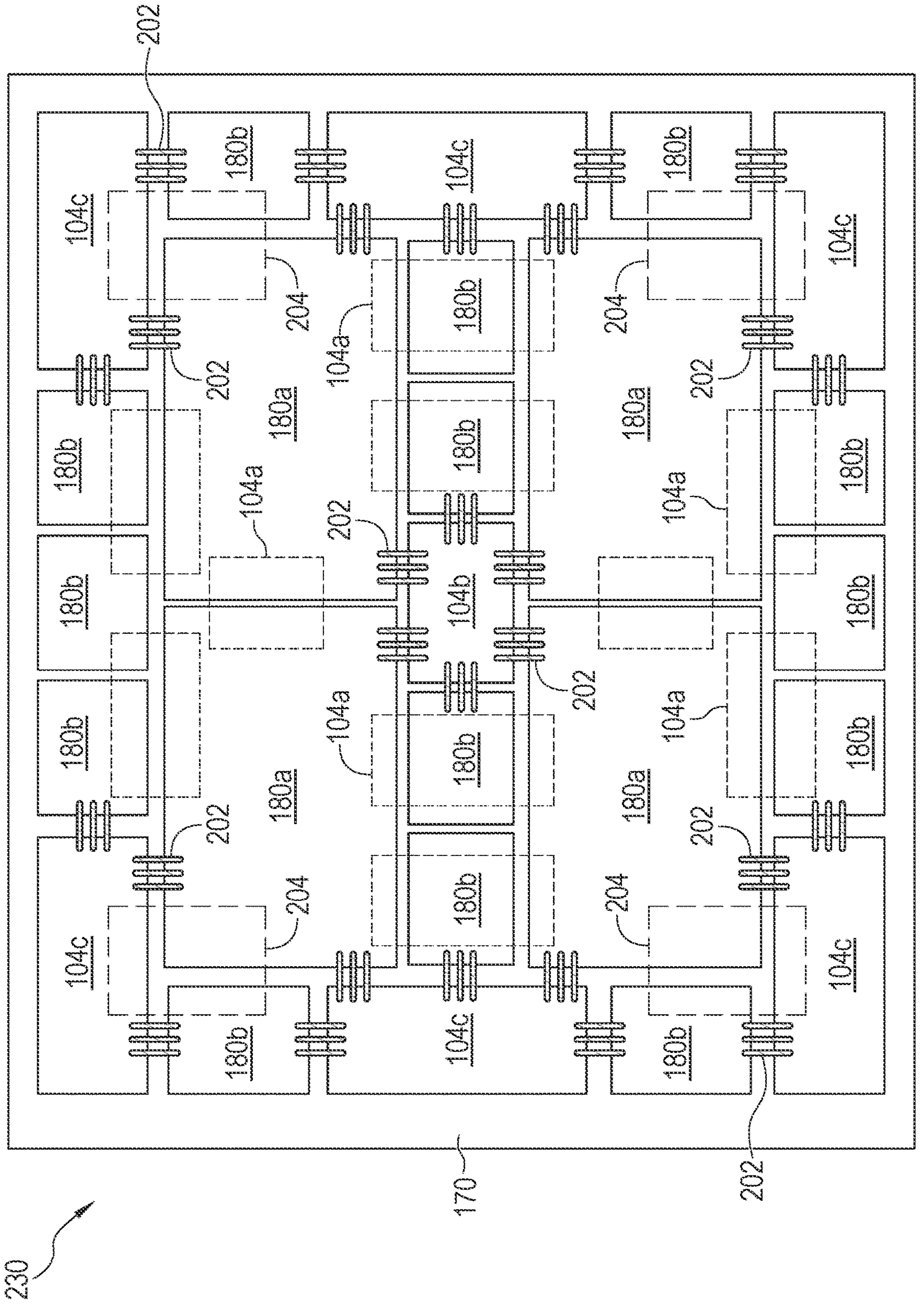
FIG. 5 illustrates another example plan view.

FIG. 5 shows a plan view of another embodiment with TSV bridge die 204. Each bridge die 204 embedded in interposer 170 overlaps with a topside bridge die 104*c*, a main die 180*a*, and an HBM die 180*b*. Bridge die 104*c* are for interconnect between main die 180*a* and HBM die 180*b* or can be replaced with a NAND flash module or I/O die in other embodiments. Bridge die 204 connects together all three overlying die.

Figure 6A:
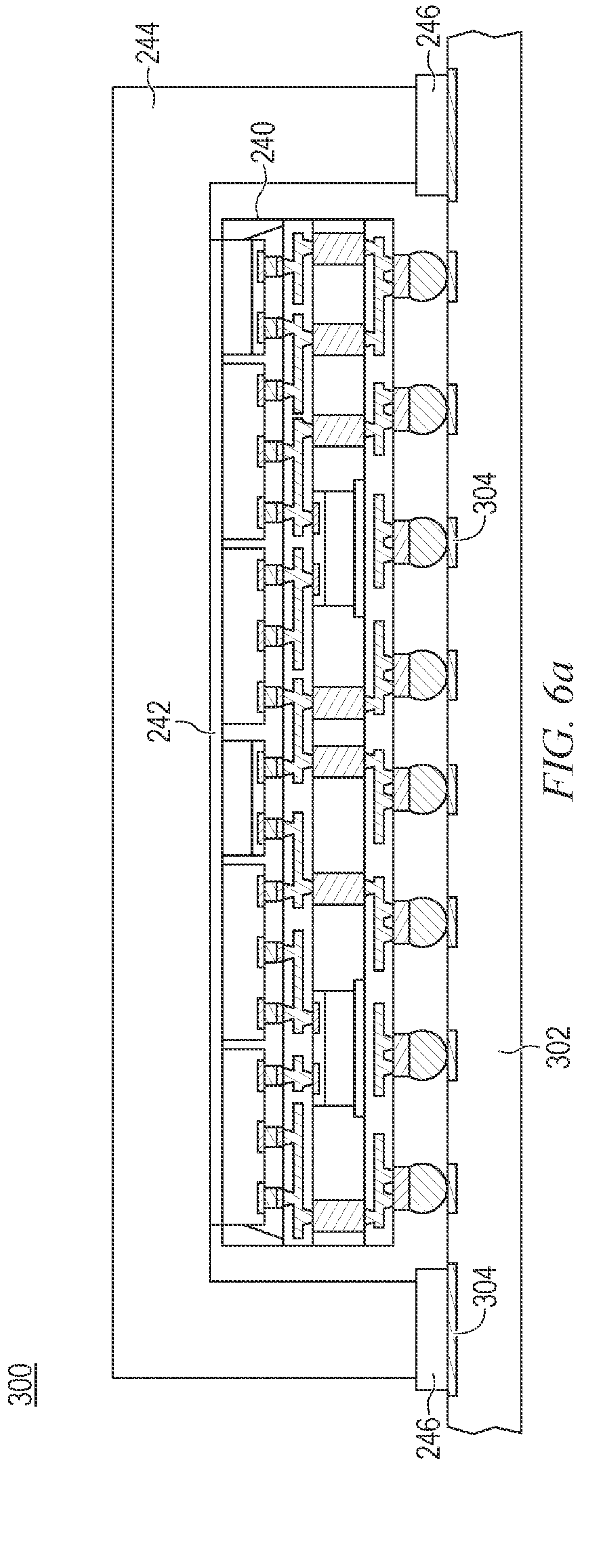
FIGS. 6*a* and 6*b* illustrate an electronic device with the system-in-package modules.
Figure 6B:
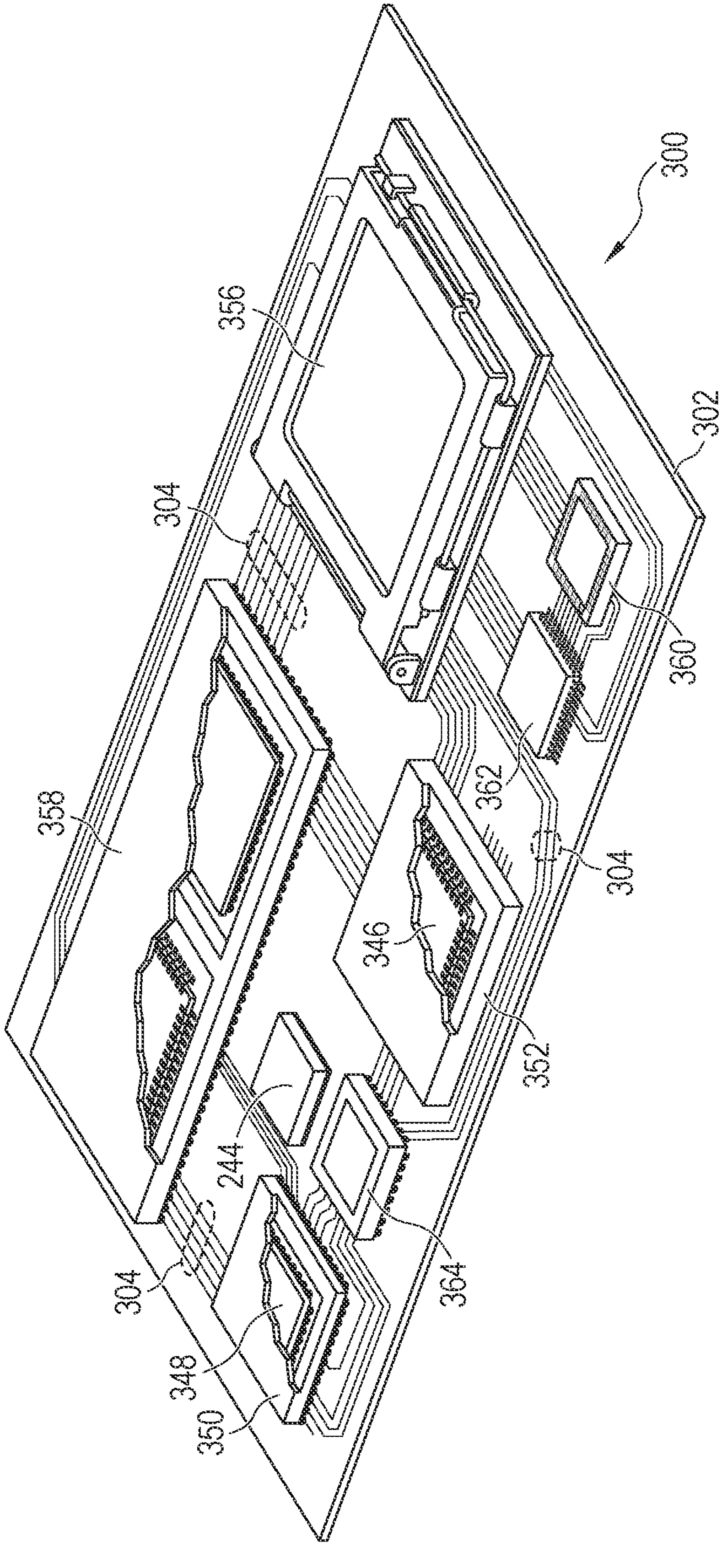

FIGS. 6*a* and 6*b* illustrate integrating the above-described SiP modules into a larger electronic device 300. FIG. 6*a* illustrates a partial cross-section of a SiP module 240 mounted onto a printed circuit board (PCB) or other substrate 302 as part of electronic device 300. SiP module 240 is similar to SiP module 190 formed above, but has encapsulant 188 coplanar to the back surfaces of main die 180*a*, HBM die 180*b*, bridge die 104*b*, and bridge die 104*c*. Encapsulant 188 can be made coplanar by backgrinding, film-assisted molding, or another suitable means.

Bumps 194 are reflowed onto conductive layer 304 of PCB 302 to physically attach and electrically connect SiP module 240 to the PCB. In other embodiments, thermocompression or other suitable attachment and connection methods are used. In some embodiments, an adhesive or underfill layer is used between SiP module 240 and PCB 302. Semiconductor die 180 are electrically coupled to conductive layer 304 through bumps 194 and interposer 170. A thermal interface material (TIM) 242 is disposed on the back surface of SiP module 240, including directly on the back surfaces of the die exposed from encapsulant 188.

A lid 244 is disposed over SiP module 240 and attached to PCB 302 using an adhesive 246. Lid 244 is formed of copper, steel, gold, aluminum, or another thermally conductive material to operate as a heat spreader. In some embodiments, adhesive 246 is electrically conductive and operates to electrically couple lid 244 to conductive layer 304 on PCB 300. Lid 244 can thereby be connected to ground and help with electromagnetic interference reduction. Lid 244 can be only a ring around SiP module 240 instead of extending over and completely covering the SiP module. Using a ring instead of a complete lid allows a heatsink to later be mounted directly to the exposed die.

FIG. 6*b* illustrates electronic device 300 including PCB 302 with a plurality of semiconductor packages mounted on a surface of the PCB, including SiP module 240. Electronic device 300 can have one type of semiconductor package, or multiple types of semiconductor packages, depending on the application. Electronic device 300 can be a stand-alone system that uses the semiconductor packages to perform one or more electrical functions. Alternatively, electronic device 300 can be a subcomponent of a larger system. For example, electronic device 300 can be part of a tablet computer, cellular phone, digital camera, communication system, or other electronic device. Electronic device 300 can also be a graphics card, network interface card, or another signal processing card that is inserted into a computer. The semiconductor packages can include microprocessors, memories, ASICs, logic circuits, analog circuits, RF circuits, discrete active or passive devices, or other semiconductor die or electrical components.

In FIG. 6*b*, PCB 302 provides a general substrate for structural support and electrical interconnection of the semiconductor packages mounted on the PCB. Conductive signal traces 304 are formed over a surface or within layers of PCB 302 using evaporation, electrolytic plating, electroless plating, screen printing, or other suitable metal deposition process. Signal traces 304 provide for electrical communication between the semiconductor packages, mounted components, and other external systems or components. Traces 304 also provide power and ground connections to the semiconductor packages as needed.

In some embodiments, a semiconductor device has two packaging levels. First level packaging is a technique for mechanically and electrically attaching the semiconductor die to an intermediate substrate. Second level packaging involves mechanically and electrically attaching the intermediate substrate to PCB 302. In other embodiments, a semiconductor device may only have the first level packaging where the die is mechanically and electrically mounted directly to PCB 302.

For the purpose of illustration, several types of first level packaging, including bond wire package 346 and flipchip 348, are shown on PCB 302. Additionally, several types of second level packaging, including ball grid array (BGA) 350, bump chip carrier (BCC) 352, land grid array (LGA) 356, multi-chip module (MCM) 358, quad flat non-leaded package (QFN) 360, quad flat package 362, and embedded wafer level ball grid array (eWLB) 364 are shown mounted on PCB 302 along with SiP module 240. Conductive traces 304 electrically couple the various packages and components disposed on PCB 302 to SiP module 240, giving use of main die 180*a* to other components on the PCB.

Depending upon the system requirements, any combination of semiconductor packages, configured with any combination of first and second level packaging styles, as well as other electronic components, can be connected to PCB 302. In some embodiments, electronic device 300 includes a single attached semiconductor package, while other embodiments call for multiple interconnected packages. By combining one or more semiconductor packages over a single substrate, manufacturers can incorporate pre-made components into electronic devices and systems. Because the semiconductor packages include sophisticated functionality, electronic devices can be manufactured using less expensive components and a streamlined manufacturing process. The resulting devices are less likely to fail and less expensive to manufacture resulting in a lower cost for consumers.

While one or more embodiments of the present invention have been illustrated in detail, the skilled artisan will appreciate that modifications and adaptations to those embodiments may be made without departing from the scope of the present invention as set forth in the following claims.

What is claimed:

1. A method of making a semiconductor device, comprising:

providing a first interconnect structure;

providing a first bridge die including a front surface, a back surface opposite the front surface, and a first fine-pitched interconnect structure formed over the front surface, wherein the first fine-pitched interconnect structure includes a line spacing or line width of less than two microns;

disposing the first bridge die over the first interconnect structure with the back surface of the first bridge die oriented toward the first interconnect structure;

depositing an encapsulant over the first bridge die after disposing the first bridge die over the first interconnect structure;

forming a second interconnect structure over the first bridge die and the encapsulant, wherein the first fine-pitched interconnect structure of the first bridge die is directly electrically coupled to the second interconnect structure; and mounting a second bridge die onto the second interconnect structure opposite the first bridge die and the encapsulant, wherein the second bridge die includes a second fine-pitched interconnect structure oriented toward and directly electrically coupled to the second interconnect structure, and wherein the second fine-pitched interconnect structure includes a line spacing or line width of less than two microns.

2. The method of claim 1, further including forming a conductive via through the first bridge die.

3. The method of claim 1, further including forming a conductive pillar or conductive via through the encapsulant from the first interconnect structure to the second interconnect structure.

4. The method of claim 1, further including:

disposing a first semiconductor die over the second interconnect structure within a footprint of the first bridge die; and disposing a second semiconductor die over the second interconnect structure within the footprint of the first bridge die.

5. The method of claim 4, further including disposing a third semiconductor die over the second interconnect structure with the second bridge die between the first semiconductor die and the third semiconductor die.

6. The method of claim 1, further including:

disposing a die-attach adhesive on the first interconnect structure; and disposing the first bridge die on the die-attach adhesive, wherein the die-attach adhesive extends from the first interconnect structure to the first bridge die.

7. A method of making a semiconductor device, comprising:

providing a first bridge die including a front surface, a back surface opposite the front surface, and a first fine-pitched interconnect structure formed over the front surface;

depositing an encapsulant over the first bridge die;

forming a first interconnect structure over the first bridge die and the encapsulant, wherein the first fine-pitched interconnect structure is oriented toward and directly electrically coupled to the first interconnect structure; and mounting a second bridge die onto the first interconnect structure opposite the first bridge die and the encapsulant, wherein the second bridge die includes a second fine-pitched interconnect structure oriented toward and directly electrically coupled to the first interconnect structure.

8. The method of claim 7, further including forming a second interconnect structure on the encapsulant opposite the first interconnect structure.

9. The method of claim 8, further including forming a conductive via through the first bridge die.

10. The method of claim 8, further including forming a conductive pillar or conductive via through the encapsulant from the first interconnect structure to the second interconnect structure.

11. The method of claim 7, further including:

disposing a first semiconductor die over the first interconnect structure within a footprint of the first bridge die; and disposing a second semiconductor die over the first interconnect structure within the footprint of the first bridge die.

12. The method of claim 11, further including disposing a third semiconductor die over the first interconnect structure with the second bridge die between the first semiconductor die and the third semiconductor die.

13. The method of claim 7, wherein the first fine-pitched interconnect structure has a line spacing or line width of less than two microns.

14. A semiconductor device, comprising:

a first interconnect structure;

a first bridge die including a front surface, a back surface opposite the front surface, and a first fine-pitched interconnect structure formed over the front surface, wherein the first fine-pitched interconnect structure includes a line spacing or line width of less than two microns, and wherein the first bridge die is disposed over the first interconnect structure with the back surface of the first bridge die oriented toward the first interconnect structure;

an encapsulant deposited over the first bridge die, wherein the encapsulant extends to the first interconnect structure;

a second interconnect structure disposed over the first bridge die and the encapsulant, wherein the first fine-pitched interconnect structure of the first bridge die is directly electrically coupled to the second interconnect structure; and a second bridge die mounted to the second interconnect structure opposite the first bridge die and the encapsulant, wherein the second bridge die includes a second fine-pitched interconnect structure oriented toward and directly electrically coupled to the second interconnect structure, and wherein the second fine-pitched interconnect structure includes a line spacing or line width of less than two microns.

15. The semiconductor device of claim 14, further including a conductive via formed through the first bridge die.

16. The semiconductor device of claim 14, further including a conductive pillar or conductive via formed through the encapsulant from the first interconnect structure to the second interconnect structure.

17. The semiconductor device of claim 14, further including:

a first semiconductor die disposed over the second interconnect structure within a footprint of the first bridge die; and a second semiconductor die disposed over the second interconnect structure within the footprint of the first bridge die.

18. The semiconductor device of claim 17, further including a third semiconductor die disposed over the second interconnect structure with the second bridge die between the first semiconductor die and the third semiconductor die.

19. A semiconductor device, comprising:

a first bridge die including a front surface, a back surface opposite the front surface, and a first fine-pitched interconnect structure formed over the front surface;

an encapsulant deposited over the first bridge die;

a first interconnect structure disposed over the first bridge die and the encapsulant, wherein the first fine-pitched interconnect structure is oriented toward and directly electrically coupled to the first interconnect structure; and a second bridge die mounted onto the first interconnect structure opposite the first bridge die and the encapsulant, wherein the second bridge die includes a second fine-pitched interconnect structure oriented toward and directly electrically coupled to the first interconnect structure.

20. The semiconductor device of claim 19, further including a second interconnect structure formed on the encapsulant opposite the first interconnect structure.

21. The semiconductor device of claim 20, further including a conductive via formed through the first bridge die.

22. The semiconductor device of claim 20, further including a conductive pillar or conductive via formed through the encapsulant from the first interconnect structure to the second interconnect structure.

23. The semiconductor device of claim 19, further including:

a first semiconductor die disposed over the first interconnect structure within a footprint of the first bridge die; and a second semiconductor die disposed over the first interconnect structure within the footprint of the first bridge die.

24. The semiconductor device of claim 23, further including a third semiconductor die disposed over the first interconnect structure with the second bridge die between the first semiconductor die and the third semiconductor die.

* * * * *